United States Patent [19]

Ghosh et al.

[11] 3,802,968

[45] Apr. 9, 1974

[54] PROCESS FOR A SELF-ISOLATION MONOLITHIC DEVICE AND PEDESTAL TRANSISTOR STRUCTURE

[75] Inventors: Hitendra Nath Ghosh; Edward S. Wajda, both of Poughkeepsie, N.Y.

[73] Assignee: International Business Machines Corporation, Armonk, N.Y.

[22] Filed: Nov. 10, 1969

[21] Appl. No.: 875,011

[52] U.S. Cl. .................... 148/175, 29/576, 117/200, 117/201, 117/212, 148/187, 148/190, 148/191, 317/235 R

[51] Int. Cl. .......................... H01l 7/00, H01l 19/00

[58] Field of Search ............ 148/1.5, 174, 175, 186, 148/187, 190, 191; 117/200, 201, 212; 317/234, 235; 29/576, 577

[56] References Cited

UNITED STATES PATENTS

| | | | |
|---|---|---|---|
| 3,481,801 | 12/1969 | Hugle | 148/175 |
| 3,293,087 | 12/1966 | Porter | 148/175 |
| 3,089,794 | 5/1963 | Marinace | 148/1.5 |
| 3,220,896 | 11/1965 | Miller | 148/175 X |
| 3,260,624 | 7/1966 | Wiesner | 148/175 |
| 3,397,326 | 8/1968 | Gallagher et al. | 317/235 X |
| 3,440,503 | 4/1969 | Gallagher et al. | 317/235 |
| 3,441,815 | 4/1969 | Pollock et al. | 317/235 |
| 3,479,233 | 11/1969 | Lloyd | 148/174 |
| 3,502,951 | 3/1970 | Hunts | 317/235 |
| 3,506,893 | 4/1970 | Dhaka | 317/235 |
| 3,244,950 | 4/1966 | Ferguson | 317/235 |
| 3,582,724 | 6/1971 | Nakahara et al. | 317/235 |
| 3,585,464 | 5/1971 | Castrucci et al. | 148/175 X |
| 3,596,149 | 7/1971 | Makimoto | 317/235 R |
| 3,427,709 | 2/1969 | Schutze et al. | 148/175 X |
| 3,484,309 | 12/1969 | Gilbert | 148/187 X |
| 3,591,430 | 7/1971 | Schlegel | 148/175 |

OTHER PUBLICATIONS

Ashar et al., "Semiconductor Device Structure and Method of Making," IBM Tech. Discl. Bull., Vol. 11, No. 11, April 1969, pp. 1529–1530.

Hilbiber, B. F., "High Performance Lateral Geometry–Circuits," IEEE Trans. on Electron Devices, Vol. ED–14, No. 7, July 1967, pp. 381–385.

*Primary Examiner*—Charles N. Lovell
*Assistant Examiner*—W. G. Saba
*Attorney, Agent, or Firm*—Kenneth R. Stevens; Robert J. Haase

[57] ABSTRACT

A process for forming a self-isolated monolithic device by providing a substrate of a first conductivity type and forming an epitaxial layer of same conductivity type over the substrate. The epitaxial layer and the substrate are subjected to treatment so as to outdiffuse an impurity of opposite conductivity from the substrate and into the epitaxial layer so as to form a region which constitutes an element of the integrated circuit device and also defines an isolation PN junction with the epitaxial layer. Further, a pedestal transistor process forms a pedestal transistor for monolithic circuits by outdiffusing an impurity to form a subcollector region and outdiffusing another impurity having a higher diffusion rate to form the pedestal region. An extrinsic collector region defines an extrinsic junction with a lighter doped extrinsic base region so as to reduce overall base to collector capacitance.

5 Claims, 9 Drawing Figures

INVENTORS
HITENDRA N. GHOSH
EDWARD S. WAJDA

BY Kenneth R. Stevens
ATTORNEY

PROCESS FOR A SELF-ISOLATION MONOLITHIC DEVICE AND PEDESTAL TRANSISTOR STRUCTURE

BACKGROUND OF THE INVENTION

1. Field of the Invention

This invention relates to semiconductor processes and the resulting semiconductor device structures, and more particularly to an improved process for forming an integrated circuit pedestal transistor structure and also to an improved process for forming a self-isolated semiconductor device for monolithic form.

2. Brief Description of the Prior Art

In the fabrication of monolithic semiconductor integrated circuit devices, it is extremely important to obtain high packing density without sacrificing electrical performance qualities. As is previously well known, electric isolation must be provided between the adjacent semiconductor devices on a monolithic substrate. Normally, electrical isolation is achieved by providing isolation diffusion regions which reach through an epitaxial layer, the epitaxial layer being of one type, to an underlying layer of opposite conductivity type. Such prior art isolation diffusion techniques severely limit the attainability of high packing densities.

It also has been shown that a retrograded impurity gradient is desirable in the collector region of a transistor in order to increase high frequency performance of the transistor. Such a gradient is one in which the impurity concentration progresses from a maximum in the subcollector region towards a minimum at the collector-base junction. Also, it has recently been shown that pedestal type transistor structures offer many advantages as to high frequency performance.

A pedestal type collector structure, as described in U.S. Pat. No. 3,312,881, Yu, somewhat avoids this necessary compromise while further improving high frequency response. This prior art patent describes how to obtain thin base widths and minimal attendant base resistance increases by providing a relatively large base contact. In order that accompanying larger base-collector junction capacitance is not sacrificed at high frequency performance, an intrinsic (material) layer is extended from the extrinsic operational portion of the base-collector junction to the surface of the device. However, in order to obtain transistor operation in the extremely high frequency range, for example in gigahertz ($10^9$), numerous other design parameters need be considered which are related to the method of fabricating the device within extremely close tolerances. The following noted parameters are extremely important to high frequency performance.

It has been found that base time delay, an important factor of $F_T$, is directly proportional to the square of the base width, $W^2$, and is therefore quite sensitive to collector voltage variations. Moreover, dynamic base width widening is large as injected current density from the emitter causes a charge neutralization effect in the collector region next to the base-collector junction. This phenomena, sometimes referred to as the "Kirk" effect, occurs when the emitter current density becomes comparable to the collector bulk doping and results in the collector junction being electrically pushed deeper into the bulk collector region. Accordingly, base width time delay is particularly sensitive when the base widening is large. Also, the base widening phenomena or "Kirk" effect imposes a restriction on the ultimate use of smaller device geometry or dimensions. Normally, smaller dimensions are coupled with increased current density flows so as to further increase the problem of base widening. Thus, a compromise is required between small dimensions and the effects of the base widening phenomena.

In the past, collector depletion transit time is minimized by maintaining depletion layer thickness, $X_m$, at a small value. Lowering the resistivity on that side of the collector junction into which most of the depletion layer extends, will aid in accomplishing this desired result. Of course, the depletion layer thickness, $X_m$, and its influence on high frequency performance, is related to $v_{sc}$, the scattering limited velocity of the carriers.

Furthermore, it is known that excess phase is directly dependent upon the magnitude of the built-in field in the base region. The cutoff frequency for the base transport factor is theoretically at a 45° phase angle. Empirically, this angle is greater and has been measured at an excess phase of more than 12° over the 45° value for graded base transistors. This excess phase is dependent upon the steepness of the base impurity gradient, $N'_B/N_{BC}$, where $N'_B$ is the base impurity concentration under the emitter junction and $N_{BC}$ is the background impurity concentration in the collector region. As a result of this occurrence, the high frequency performance of a grounded emitter type transistor is associated with a phase correction constant, $K_\theta$. The $K_\theta$ value is optimized towards $K_\theta = 1$ by producing a retarding field in the base region.

Another factor which is related to the base transit time is the diffusion constant in the base or graded base regions. Quite significantly, the effect of collector and emitter resistances and their respective transition capacitances exercise control over the high frequency performance. As previously mentioned, the base width W is a significant factor in high frequency operation and it is to be realized that for a graded base structure the base sheet resistance, $R_{BB}$, is related to $\beta/W$, where $\beta$ is resistivity in ohm-centimeter. The $R_{BB}$ value for high frequency performance is significant and must take into account the $N'_B/N_{BC}$ ratio, $N'_B$, W, and the electron mobility in the base $\mu_{nb}$.

Accordingly, improved processes for optimizing these numerous design parameters is necessary and required in order to obtain high frequency performance in the resulting monolithic integrated circuit devices. The latitude and tolerance variations which were permissible with discrete transistor devices or even with monolithic devices when operating at relatively higher frequency are no longer endurable.

More particularly, when fabricating a pedestal transistor formed in a substrate and epitaxial layer, both of the same conductivity type, improved high frequency performance is obtainable in a self-isolated structure by controlling the impurity concentration in the extrinsic base region.

SUMMARY OF THE INVENTION

It is, therefore, an object of the present invention to provide an improved process for fabricating self-isolated devices, such as transistors and diodes, in monolithic form.

It is another object of the present invention to provide an improved single epitaxial process for manufacturing integrated circuit pedestal transistors suitably adapted for monolithic form which eliminates restrictions as to obtaining smaller dimensions, while eliminating undesirable base-widening and base-collector capacitance problems.

It is a further object of the present invention to reduce overall base-collector capacitance in a pedestal transistor comprising a substrate and a single epitaxial layer so as to improve high frequency performance of the resulting device.

In accordance with the aforementioned objects, the present invention provides improved process for fabricating self-isolated monolithic devices by selectively outdiffusing from a substrate, over which has been grown an epitaxial layer. The substrate and epitaxial layer are of the same conductivity type. Also, the present invention provides an improved pedestal transistor fabrication process for forming pedestal devices on a substrate of one conductivity type over which has been formed an epitaxial layer of the same conductivity type, so as to reduce overall base to collector capacitance for this type of structure by outdiffusing an impurity to form a subcollector region and outdiffusing another impurity having a higher diffusion rate to form a pedestal region.

The foregoing and other objects, features, and advantages of the invention will be apparent from the following more particular description of the embodiments of the invention, as illustrated in the accompanying drawings, wherein:

BRIEF DESCRIPTION OF THE PREFERRED EMBODIMENTS

Figures 1A, 1B, 2A:
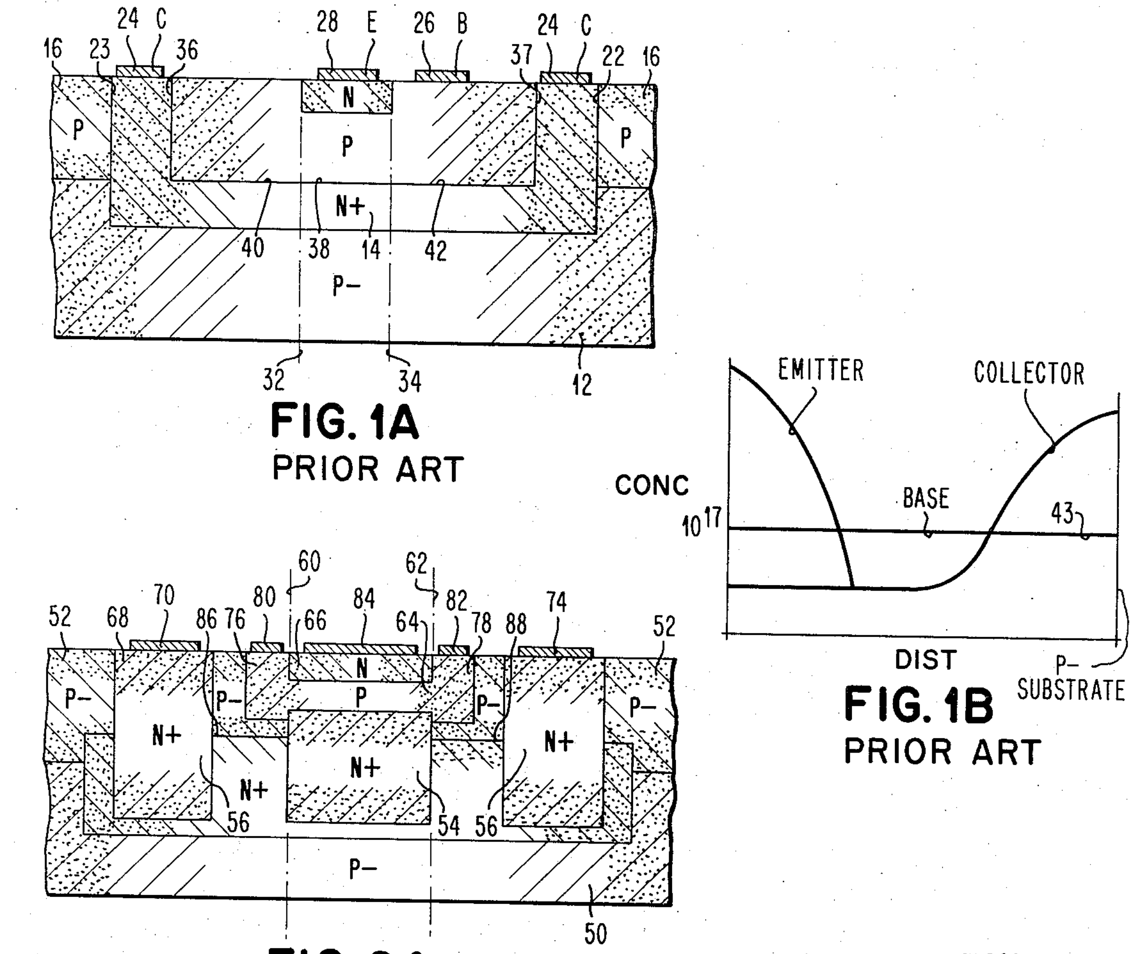
FIG. 1A PRIOR ART, FIG. 1B PRIOR ART, FIG. 2A
FIG. 1A is a cross-sectional view illustrating a partial section of a known monolithic integrated circuit transistor having an epitaxial base region and its accompanying impurity profile is shown in FIG. 1B.
FIG. 2A illustrates an improved self-isolated device of the present invention, and FIGS. 2B and 2C its impurity profile in the emitter and extrinsic base region, respectively.

The monolithic integrated circuit of FIG. 1A illustrates an epitaxial base planar transistor device formed on a $P^-$ substrate 12 in accordance with conventional photolitho-graphic, etching, and diffusion techniques. The collector comprises an $N^+$ subcollector region 14 and a P type epitaxial layer 16 forms the base region. Reach-through regions 22 and 23 provide a low conductivity path to the buried subcollector region 14. Appropriate contacts 24, 26, and 28 provide device terminals to the collector, base, and emitter, respectively. The resulting transistor of FIG. 1A is self-isolated and does not require an additional isolation diffusion. The buried subcollector region 14 and the regions 22 and 23 define a PN junction with the substrate and epitaxial layer so as to electrically isolate the transistor device from other devices formed on the substrate 12, during operation. In the known structure of FIG. 1A, the region between lines 32 and 34, when extended transversely through the device, constitute the internal portion of the transistor. That is, in this region of the device the necessary transistor action occurs. The regions to the left and right of lines 32 and 34, respectively, constitute the extrinsic regions of the device. These extrinsic regions are not really necessary for transistor operation but are required for electrical contact to the base elements. The overall base to collector junction determines the overall base to collector capacitance and this is a major factor in limiting the overall high frequency performance. The base to collector junction consists of a pair of vertical junctions 36 and 37, an internal horizontal junction 38 located between lines 32 and 34, and a pair of extrinsic horizontal junctions 40 and 42. It has been found that the extrinsic base to collector junctions 40 and 42 contribute to a major portion of the overall base to collector capacitance. The vertical junctions 36 and 37 are very shallow compared to the length of the horizontal portion of the junction and thus are not a major factor. As illustrated in FIG. 1B, a constant base doping level, curve 43, intersects the emitter and collector diffusion curves, designated as 44 and 45, respectively. Thus, high collector-base capacitance can't be avoided in the extrinsic zone.

The pedestal structure of the present invention, as shown in FIG. 2A, reduces base-collector capacitance in the horizontal and vertical extrinsic regions of the transistor and accordingly decreases the overall base to collector capacitance so as to improve high frequency performance. This is particularly so in small geometry devices where emitter area is becoming increasingly smaller compared to total collector-base junction area. The pedestal transistor device is formed on a $P^-$ substrate 50. Extending from the substrate 50 into an epitaxial layer 52 is an internal pedestal collector portion 54 and an extrinsic collector region 56 is located to the left and right of the lines 60 and 62. The region within lines 62 and 64 constitute the internal operational portion of the pedestal device. The P type base region 64 and the N type emitter region 66 complete the internal elements of the pedestal device. The collector regions 54 and 56 are formed of an $N^+$ type conductivity impurity. The $N^+$ regions 56 provide a low resistivity path from collector contacts 70 and 74 to the buried subcollector portion 71 of the transistor. A P base diffusion 76 and 78 formed in the $P^-$ epitaxial layer 52 provide a low resistivity contact to the internal base region 64 and connect to the pair of base contacts 80 and 82. Finally, a conventional emitter contact 84 makes electrical contact with the emitter region 66. As illustrated in FIG. 2A, the extrinsic base-collector horizontal junctions, designated as 86 and 88, are defined by a lightly doped P conductivity type impurity in the $P^-$ epitaxial layer and a highly doped $N^+$ conductivity type impurity in the extrinsic collector region. This lightly doped extrinsic base region, as compared to the doping level in the internal base region, results in decreased base to collector capacitance at the junctions 86 and 88. As was previously mentioned, these junctions 86 and 88 contribute a major portion to the overall base to collector capacitance and therefore a reduction in capacitance in these areas significantly reduce the overall capacitance and results in improved high frequency performance of the transistor. This result occurs because the capacitance contributed by a junction is primarily controlled by the side of the junction which is lighter doped, i.e., weak-side doping. The lighter doped $P^-$ material in the extrinsic base region allows for a wider depletion region and a corresponding decrease in capacitance.

Figure 2B:
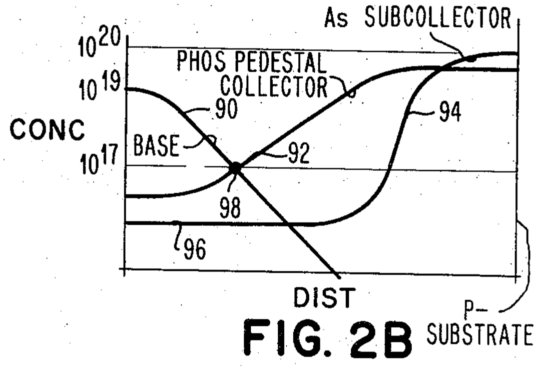
Figure 2C:
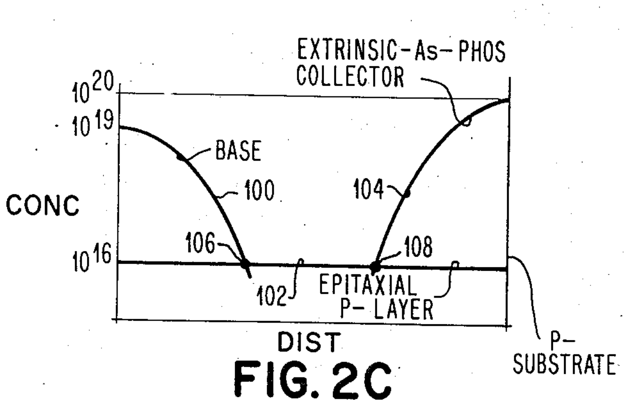

A comparison of the impurity profiles for the FIGS. 2A and 2B illustrate the advantages of the present invention in a slightly different manner. For the region under the emitter, shown in FIG. 2B, curve 90 represents the impurity concentration for the base diffusion; curve 92 represents the impurity profile concentration for a phosphorus outdiffusion which forms the pedestal region; and curve 94 represents the impurity profile for a buried outdiffused arsenic subcollector which meets with the $P^-$ epitaxial layer at that portion of the curve indicated as 96. Therefore, as can be seen by the intersection of the curves 90 and 92 at point 98, the concentration between the base and collector regions along the entire portion of the internal horizontal base-collection is high. However, the impurity profile in the extrinsic portion, as illustrated in FIG. 2C, shows that the doping level is controlled so as to reduce the overall base to collector capacitance. The impurity in the base region is shown by curve 100 which intersects the horizontal line 102 which represents the $P^-$ epitaxial base region. Also, the retrograded extrinsic collector impurity profile is illustrated by curve 104 which intersects curve 102 at point 108. The separation between points 106 and 108 represents the controlled doping level over that distance for a single extrinsic base-collector junction, such as shown at 86. The profile of the internal region of the transistor is still as given by FIG. 2A to satisfy the need for higher current density operation. Also, varying the thickness of the epitaxial layer 52 allows some latitude in reaching the first concentration level for point 98.

Figure 3:
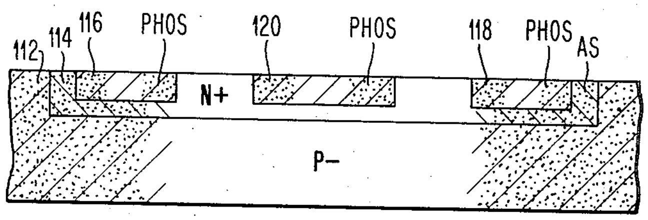
FIGS. 3 through 6 illustrate, in a cross-sectional view, a portion of the monolithic integrated circuit and the successive process steps employed in the fabrication of a pedestal transistor structure according to the present invention, as well as the self-isolation process of the present invention.
Figure 4:
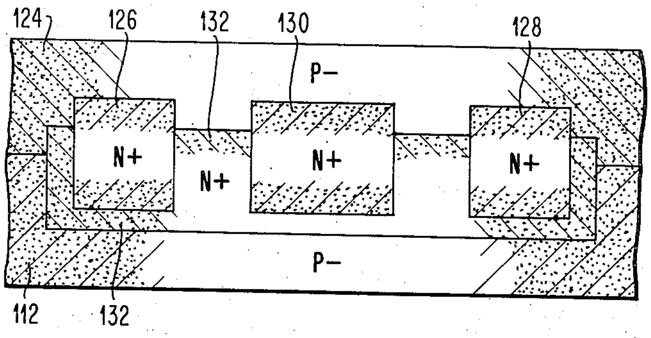

FIGS. 3 through 6 illustrate the successive steps for fabricating a pedestal transistor and a self-isolated device according to the present invention. In FIG. 3, a $P^-$ type substrate 112 is subjected to conventional diffusion steps in order to produce an $N^+$ region 114 and a plurality of selectively diffused $N^+$ type regions therein. The region 114 is formed by diffusing an impurity such as arsenic into the $P^-$ substrate 112. An impurity such as phosphorus is also introduced into the region 114 to form regions 116, 118, and 120. Phosphorus has a diffusion rate approximately four times greater than arsenic. The regions 116 and 118 constitute self-isolation regions and region 120 defines the pedestal collector region. Thereafter, a $P^-$ epitaxial layer is grown on the surface 122 so as to produce an epitaxial layer 124, as shown in FIG. 4. During the formation of the epitaxial layer 124, the arsenic and phosphorus regions outdiffuse into the epitaxial $P^-$ layer 124. The isolation regions 116 and 118 outdiffuse into the epitaxial layer 124 so as to produce regions 126 and 128, respectively. The centrally located pedestal collector region 120 outdiffuses into the epitaxial layer 124 to produce new region 130. Since arsenic has the much lower diffusion rate, the region 114 outdiffuses into the epitaxial layer 124 to a much lesser extent and creates what amounts to an arsenic outdiffused subcollector portion 132, extending from the $P^-$ substrate 112 and into the epitaxial layer 124.

Figure 5:
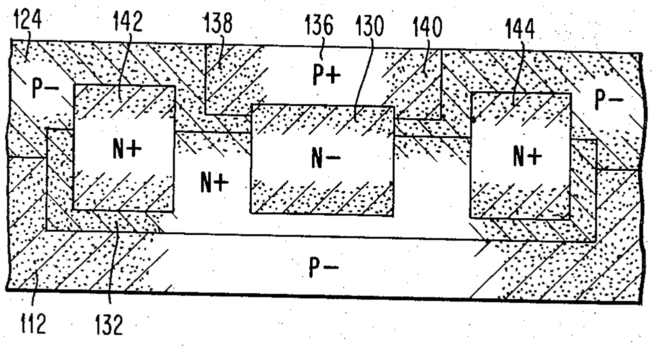
Figure 6:
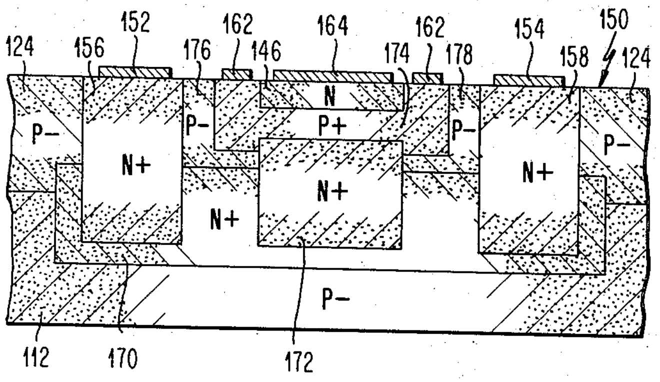

FIGS. 5 and 6 illustrate the formation of the internal base and emitter regions, the outdiffusion of the new isolation regions 142 and 144, and the pedestal collector region 130, and finally the application of contacts, and the attendant reach-through diffusions for providing low resistivity contact to the active elements of the pedestal transistor. In FIG. 5, a P type conductivity base region 136 is formed by diffusion in the $P^-$ type epitaxial layer 124. Extrinsic base regions 138 and 140 can be formed at the same time that base region 136 is formed; as in the conventional process. Regions 138 and 140 provide low resistivity contact from the upper surface of the epitaxial layer to the internal base region. In the alternative, the same result may be obtained by depositing a boron doped oxide over the $P^-$ epitaxial layer. The boron having a doping level of $10^{19}$ atoms/cc can be deposited over the entire epitaxial layer and then removed in those areas where no other diffusions or contacts are to be made. Outdiffusing from the boron source will provide a low resistivity path to the internal base region as well as protecting against inversion of the $P^-$ epitaxial upper surface. During the processing or formation of the diffused P base region 136 and regions 138 and 140, the regions 126 and 128 are being outdiffused towards the upper surface of the epitaxial $P^-$ layer 124 and are now shown as regions 142 and 144. During the formation of the N type conductivity emitter region 146, FIG. 6, the $N^+$ regions 142 and 144 are effectively outdiffused to the surface 150 of the $P^-$ epitaxial layer 124. It may be necessary to provide suitable $N^+$ conductivity indiffusions to provide the precise low resistance values for compatibility with the collector contacts 152 and 154. This can be done by introducing the same emitter diffusion 146 into regions 152 and 154. However, for purposes of isolation, the $N^+$ outdiffusion of regions 142 and 144, during processing, gives rise to the $N^+$ regions 156 and 158 which define a PN junction with the $P^-$ substrate, and thus isolate the pedestal transistor. The subcollector region 170 formed by the arsenic outdiffusion in the $P^-$ substrate 112 defines a PN junction with the $P^-$ substrate so as to fully complete the isolation for the pedestal transistor device.

Conventional contacts 162 and 164 are used to make electrical contact with the base and emitter regions, respectively.

The processes illustrated in FIGS. 3 through 6 thus provide for an improved process and resulting pedestal device, in addition to an improved process for forming a self-isolated semiconductor device for use in monolithic form. The lateral overhung regions as 132, 176, and 178, are desirable but can be removed without limiting the basic advantages of this invention. The junctions 86 and 88 are still formed between lightly doped $P^-$ epitaxy and an arsenic sub-collector diffusion. Although the resultant structure and attendant processes have been made applicable to an NPN transistor, it is to be understood that the principles are equally applicable to a PNP transistor. Exemplary conductivity concentrations and materials for the structure fabricated in accordance with the process steps of FIGS. 3 through 6 are described below. These values are illustrative and in no way to be construed as limiting the inventions disclosed herein.

| | Typical Concentration Values |
|---|---|
| Starting $P^-$ substrate (112) | 10–15 cm. |
| Buried arsenic layer (170) | $C_o = 2 \times 10^{20}/cm^3$ |
| Outdiffused regions (156, 158, 172) | $6 \times 10^{16}$ at the surface |
| Intrinsic base region (174) | $C_o = 10^{19}$ |

-Continued

| | Typical Concentration Values |
|---|---|
| Extrinsic base region (176, 178) | $C_o = 10^{19}$ |
| Emitter region (146) | $C_o = 10^{21}$ |
| Epitaxial layer (124) | $10^{16}$ |

These typical values correspond to the regions as shown in FIG. 6.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A method for forming self-isolated integrated circuit devices comprising the steps of a. providing a semiconductor substrate of a first conductivity type;

b. introducing two impurities of a second conductivity type, opposite to said first conductivity type, having mutually different diffusion rates, into said substrate through a plurality of spaced surface locations, said impurity having a higher diffusion rate being introduced at a plurality of separate locations within the region defined by the impurity having a lower diffusion rate for forming an intrinsic pedestal collector region and an extrinsic collector region, said pedestal collector region being separated from and surrounded by said extrinsic collector region;

c. forming an epitaxial layer of semiconductor material of said first conductivity type on said substrate;

d. the heating associated with forming said epitaxial layer simultaneously outdiffusing said impurities, said impurity having the higher diffusion rate outdiffusing into said epitaxial layer toward the upper surface of said epitaxial layer and said impurity having the lower diffusion rate outdiffusing to a lesser extent into said expitaxial layer;

e. introducing a base region of first conductivity type into said epitaxial layer to form said pedestal collector region by compensation of said impurity having the higher diffusion rate which outdiffused from one of said separate locations; and f. introducing an emitter region of seocnd conductivity type into said base region over said pedestal collector region;

g. the further heating associated with introducing said base and emitter regions simultaneously outdiffing said impurities, said impurity having the higher diffusion rate outdiffusing through said epitaxial layer to reach the upper surface of said epitaxial layer and said impurity having the lower diffusion rate outdiffusing only partially through said epitaxial layer.

2. A method for forming self-isolated integrated circuit devices comprising the steps of forming at least one device as in claim 1 wherein said base region is spaced from said impurity having the higher diffusion rate which outdiffused from said separate locations other than from said one location.

3. A method for forming self-isolated integrated circuit devices comprising the steps of forming at least one device as in claim 2 wherein said base region is also spaced from said impurity having the lower diffusion rate which outdiffused from the respective one of said spaced locations.

4. A method for forming self-isolated integrated circuit devices comprising the steps of forming at least one device as in claim 1 wherein said first and second conductivity types are P and N, respectively.

5. A method for forming self-isolated integrated circuit devices comprising the steps of forming at least one device as in claim 1 wherein said impurity having the higher diffusion rate and said impurity having the lower diffusion rate are phosphorus and arsenic, respectively.

* * * * *

PO-1050
(5/69)

UNITED STATES PATENT OFFICE
CERTIFICATE OF CORRECTION

Patent No. 3,802,968 Dated April 9, 1974

Inventor(s) Hitendra Nath Ghosh and Edward S. Wajda

It is certified that error appears in the above-identified patent and that said Letters Patent are hereby corrected as shown below:

Column 5, Line 33 (In the Specification "first" should be --final--

Signed and sealed this 5th day of November 1974.

(SEAL)
Attest:

McCOY M. GIBSON JR.
Attesting Officer

C. MARSHALL DANN
Commissioner of Patents